United States Patent [19]
Hartmann

[11] 3,855,556
[45] Dec. 17, 1974

[54] SELECTABLE FREQUENCY BANDPASS FILTER

[75] Inventor: Clinton S. Hartmann, Dallas, Tex.

[73] Assignee: Texas Instruments Incorporated, Dallas, Tex.

[22] Filed: Apr. 2, 1973

[21] Appl. No.: 347,115

[52] U.S. Cl. .................... 333/72, 310/9.8, 333/30 R
[51] Int. Cl. ........ H03h 9/26, H03h 9/30, H03h 9/32
[58] Field of Search ............ 333/72, 71, 30 R, 70 R; 310/8.2, 9.5, 9.7, 9.8

[56] References Cited

UNITED STATES PATENTS

| | | | |
|---|---|---|---|
| 3,479,572 | 11/1969 | Pokorny | 333/72 X |
| 3,621,482 | 11/1971 | Adler | 333/72 |
| 3,663,899 | 5/1972 | Dievlesaint et al. | 333/70 T |
| 3,688,223 | 8/1972 | Pratt et al. | 333/72 |
| 3,697,788 | 10/1972 | Parker et al. | 310/9.5 |
| 3,745,564 | 7/1973 | Gandolfo et al. | 310/8.1 X |
| 3,753,166 | 8/1973 | Worley et al. | 333/72 |
| 3,766,496 | 10/1973 | Whitehouse | 310/9.8 X |

OTHER PUBLICATIONS

Tancrell et al., "Acoustic Surface Wave Filters" in Proceedings of the IEEE, Vol. 59, No. 3 March 1971, pp. 393–403.

*Primary Examiner*—Archie R. Borchelt
*Assistant Examiner*—Marvin Nussbaum
*Attorney, Agent, or Firm*—Harold Levine; James T. Comfort; William E. Hiller

[57] ABSTRACT

A selectable frequency bandpass filter includes a set of electrical filters with each of which is associated a switch. By closing appropriate switches a subset of the set of electrical filters is connected in parallel between the input and the output of the selectable frequency filter. Each of the electrical filters has a frequency response which consists of a number of very narrow passbands separated by frequency regions of effectively zero transmission. By connecting the appropriate subset of electrical filters in parallel between the input and the output of the selectable frequency filter the overall frequency response is caused to have a dominant very narrow passband at one of a set of predetermined discrete frequencies. By varying the subset of electrical filters this dominant passband can be caused to occur at any of the set of predetermined frequencies. In a preferred embodiment each of the electrical filters is a properly designed surface wave delay line device.

8 Claims, 7 Drawing Figures

SELECTABLE FREQUENCY BANDPASS FILTER

This invention relates to bandpass filters and more particularly to an elastic wave or surface wave filter arranged to have a very narrow bandpass at any of a predetermined set of discrete frequencies.

Recently studies have been completed and investigations conducted to show that bulk acoustic waves propagating in solids have application as delay lines in communication systems, radar systems, and data processing systems. Now effort is being expanded in studying the application of surface waves in various device configurations including surface wave transducers, delay lines, decoders, filters, and surface wave amplifiers. Advances such as improved compound semiconductor materials, hereomaterial systems, integrated circuits, and piezoresistance phenomena combined with surface wave phenomena has lead to many interesting and useful devices.

The theory of elastic wave propagation at the surface of a solid has not to date been thoroughly developed primarily because of a complexity of the surface wave phenomena. Several types of elastic waves traveling along the surface of the solid have however been identified. These include Rayleigh waves, Love waves, and guide waves. Of these several types of elastic waves only the Rayleigh wave will be considered. However, the invention is applicable to any filtering technique using elastic waves or other waves. A Rayleigh wave is a purely surface wave traveling parallel to a stress free, plain boundary of an infinite isotropic elastic solid. Such waves can be thought of as clinging to a region near a free surface and traveling along parallel to the surface but damping out exponentially in a direction transverse to the free surface. Thus, most of the energy of the Rayleigh wave is contained within a wave length of the surface therefore the designation as a surface wave is apt.

In accordance with one application of the present invention, the local oscillator of a multichannel receiver is required to oscillate at one of a predetermined set of discrete frequencies. The selectable frequency bandpass filter is placed in the regenerative feedback path of an amplifier. Hence, the selectable frequency filter will have one dominant bandpass. The amplifier will oscillate at the center frequency of this bandpass. The dominant bandpass of the selectable frequency filter can be chosen to occur at any of the predetermined set of discrete frequencies thereby causing the amplifier to oscillate at the chosen frequency.

In accordance with one embodiment of the invention the selectable frequency filter includes nine electrical filters all of which are connected in common with the output point. Each of the electrical filters is connectable through a switch to the common input point. Each of the electrical filters is a surface wave delay line containing input and output interdigital transducers defined on the surface of a piezoelectric substrate. The output interdigital transducer has a very broad frequency response being essentially flat over the entire range of frequencies to be passed by the selectable frequency filter. The input interdigital transducer has a frequency response composed of a number of very narrow passbands separated by substantial frequency regions of zero transmission. The centers of these passbands occur at a subset of the predetermined set of discrete frequencies. Different subsets of the predetermined set of discrete frequencies are used for each of the electrical filters.

To select the dominant bandpass of the selectable frequency filter the switches associated with an appropriate subset of the set of electrical filters are closed thereby connecting this subset of electrical filters in parallel between the input and the output of the selectable frequency filter. As a result, the overall frequency response of the selectable frequency filter will be the sum of the individual frequency responses of the electrical filters so connected in parallel. Only certain allowed combinations of electrical filters can be so connected in parallel at any given time. These allowed sets of electrical filters are so chosen that for any one of these sets there will be one frequency of the predetermined set of discrete frequencies at which each of the parallel connected electrical filters will have a very narrow bandpass. At this frequency the responses of the individual electrical filters will add to contribute a very large narrow bandpass in the response of the selectable frequency filter. Such reinforcement will not occur at any other frequency. The invention therefore constitutes a bandpass filter passing energy at this single frequency more readily than at any other frequency. By using other combinations of closed switches the bandpass frequency may be selected to occur at any of the predetermined set of discrete frequencies.

For any given number of frequencies within the predetermined set of discrete frequencies various combinations of electrical filters are within the contemplation of this invention. The frequency responses of the individual electrical filters can be chosen either for the purpose of minimizing the number of electrical filters or for the purpose of maximizing the frequency selectivity of the overall filter. Moreover, the primary frequency response determining element of any given electrical filter need not be the input interdigital transducer. This function can alternatively be performed by the output interdigital transducer or can be split between the two transducers. Furthermore, it is not necessary that surface wave delay line devices be used as the electrical filter elements in this invention. Alternatively, other devices which possess the required frequency response can be employed.

A more complete understanding of the invention and its advantages will be apparent from the specification and claims and from the accompanying drawing illustrative of the invention.

Referring to the drawings.

Figure 1A:
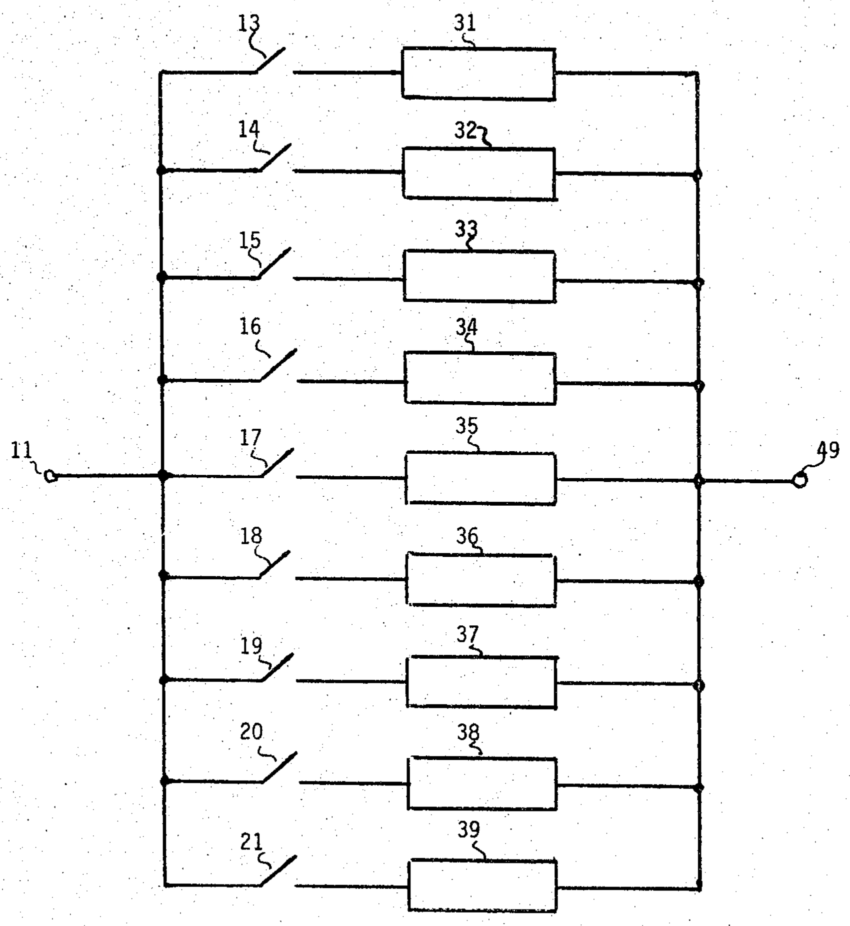
FIG. 1A shows a schematic drawing of a selectable frequency filter as constructed in accordance with the present invention.

In FIG. 1A is shown parallel structure of surface wave delay lines for performing the desired filter function. Nine surface wave delay lines 31–39 are illustrated. The outputs of the surface wave delay lines are connected to a common filter output point 49. The inputs of the delay lines are connected through switches 13–21 to a common filter input point 11. The switches shown in schematic form in a best embodiment would be semiconductor switches, well known in the art.

Figure 1B:
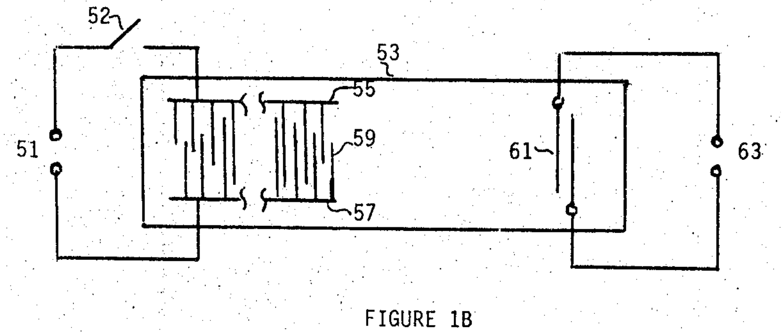
FIG. 1B is a schematic drawing of one of the individual filter elements of the frequency filter of FIG. 1A.

An expanded view of one of the surface wave delay lines is shown in FIG. 1B. The delay line is formed on a single crystalline piezoelectric substrate 53. The substrate may comprise, for example, convenient lengths of lithium niobate, quartz, zinc oxide, cadmium sulfide, or other piezoelectric materials. An input interdigital transducer shown in diagramatic form is deposited on the substrate 53. This is comprised of conductor bars 55 and 57 and a plurality of fingers 59. The conductor bars are connected through switch 52 to the input 51 of the delay line. Also deposited on the substrate is an interdigital output transducer comprised of two fingers 61. This transducer is connected to a delay line output 63. The frequency response characteristics of the input interdigital transducer will be discussed henceforth. It will be recognized by one skilled in the art that the frequency response of the output interdigital transducer is very broadband in form. Thus, the precise frequency response characteristics of the surface wave delay line are controlled by the spacing, lengths and number of interdigital fingers 59 in the input interdigital transducer. Use of the input interdigital transducer to establish the frequency response characteristics of the delay line is a matter of design choice. An alternative also within the contemplation of this invention would be to use a very broadband input transducer and to control the frequency response of the device by means of the output transducer. A second alternative would be to divide the delay line frequency response between the input and output transducers.

The electrodes 55, 57, 59 and 61 may comprise aluminum, gold, or other appropriate metals and may be formed on the substrate 53 by conventional deposition masking and etching metalization techniques or other techniques for defining a metal pattern on a surface. Conventionally a layer of metal is formed on the surface of the substrate 53 and a photoresist layer is formed to overlie this metal layer. Selected areas of the photoresist layer are exposed through a mask defining the interdigital patterns of electrodes 55, 57, 59 and 61. This mask may be formed by techniques thoroughly described in the literature. A metal underlying the exposed area is selectively etched away using an etchant of presently known composition and reaction to thereby form the required electrode patterns.

Figure 2A:
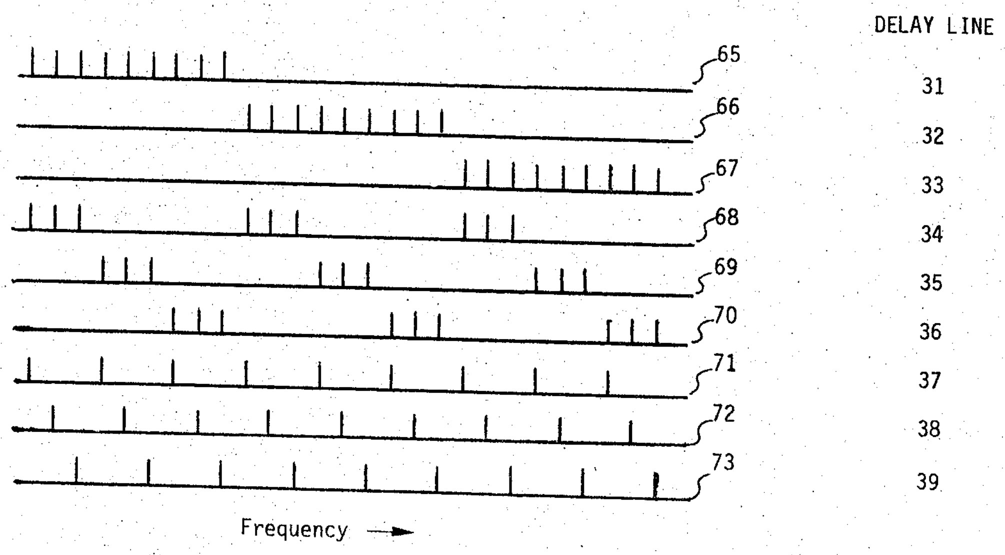
FIG. 2A illustrates one possible configuration of frequency responses for the individual electrical filters.
Figure 2B:
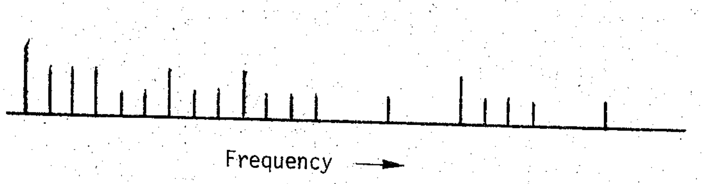
FIG. 2B illustrates the filter response resulting when a selected number of individual filter elements of the frequency filter are activated.

A functional understanding of the filter shown in FIG. 1A may be had by reference to FIGS. 2A and 2B. In FIG. 2A are shown the frequency responses 65–73 for each of the surface wave delay lines of FIG. 1A, 31–39, respectively. The frequency response 65 of delay line 31 is comprised of nine very narrow passbands separated by a region of no transmission. In this embodiment, the frequency of the lowest passband is 40 MHz and subsequent passbands are spaced at intervals of 7.5 MHz. A response within each of the passbands is equal to that within all other passbands. The responses 66 and 67 of delay lines 32 and 33 are similar to the responses of delay line 31 but are shifted upward in frequency. That is, the first passband of delay line 32 occurs at a frequency 7.5 MHz above the last passband of delay line 31. Similarly, the first passband of delay line 33 and the last passband of delay line 32 are separated by a frequency interval of 7.5 MHz. The frequency response 68 of delay line 34 consists of three clusters of three narrow passbands each. The frequencies of these nine passbands are chosen to coincide with the first three passband frequencies of each of delay lines 31 and 32, and 33. The frequency responses of delay lines 35 and 36 are similar in nature to that of delay line 34 but again are shifted upward in frequency. The frequencies of the passbands of surface wave delay line 35, for example, are chosen to coincide with the frequencies of the second cluster of three passbands of delay lines 31, 32, and 33. The passbands of delay line 37 are equispaced but at a frequency interval three times that of the passbands of delay lines 31, 32 and 33. The frequencies of the passbands of delay line 37 are chosen to coincide with the first, fourth and seventh passband of delay lines 31, 32, and 33. Similarly, the frequencies of the passbands of delay line 38 coincide with the second, fifth, and eighth passbands of delay lines 31, 32, and 33. Finally, the frequencies of the passbands of delay line 39 coincide with the third, sixth, and ninth passbands of delay lines 31, 32, an and 33.

With reference to FIG. 1A, a desired filter function is realized by closing the appropriate combination of switches 13–21. Energy introduced to the filter through input 11 will pass through those delay lines associated with the switches which are closed. The energy flowing through these delay lines will be summed at the filter output 49. In FIG. 2B is shown the filter response resulting when switches 13, 16, and 19 are closed. Under this circumstance energy at 40 mHz is passed by delay lines 31, 34, and 37. As shown in FIG. 2B, the energy passed by these three delay lines is summed at the output 49 and will be three times as great as that energy passed by any one of the delay lines. At 47.5 MHz on the other hand, only delay lines 31 and 34 have a passband. As a result, the energy in the output will be only twice that energy passed by any of the delay lines. Similar considerations lead to the responses at each of the other 27 frequencies of the filter shown in FIG. 2B. The response of the filter at 40 MHz therefore is at least 3.5 db above the response at any of the other frequencies. In the contemplation of the invention, this arrangement is considered to establish the bandpass of the filter at 40 MHz. To establish the bandpass at any of the other 27 frequencies the switches 13–21 are grouped into sets of three. The first set contains switches 13, 14, and 15; the second set, switches 16, 17, and 18; and the third set, switches 19, 20, and 21. To select a particular frequency one switch from each of these three sets will be closed. The appropriate switches for each of the 27 bandpasses are given in Table I.

An alternative embodiment would comprise 27 surface wave delay lines connected in common to the filter output and connected through 27 switches to to a common filter input. The frequency response of each of these delay lines would include a single narrow passband located at one of the 27 desired frequencies. Selection of the desired filter passband frequency would be accomplished by closing the appropriate switch. The arrangement of the present invention, however, requires only nine surface wave delay lines as constrasted with the 27 delay lines required by the alternative embodiment. Other embodiments are also within the contemplation of this invention. Illustrative of these is an arrangement similar to that of FIG. 1A but including 12 delay lines in the parallel structure. The frequency response of each of the first nine delay lines would contain just three narrow passbands separated by frequency intervals of 7.5 MHz. The cluster of three passbands for each of these delay lines would be shifted upward in frequency so that each of the 27 desired frequencies will be within a passband of one of these nine delay lines. The remaining three delay lines would be identical to delay lines 37, 38, and 39 shown in FIG. 1A. In this case, the desired frequency of the filter would be established by closing one of the nine switches associated with the first nine delay lines and one of switches 19, 20, and 21. This embodiment has the undesirable feature of requiring 12 surface wave delay lines in contrast with the nine delay lines required by the best embodiment. On the other hand, for any given choice of two closed switches, the response at the desired frequency will be at least 6 db above the response at any of the other frequencies. Thus, in certain cases there is a tradeoff between the number of surface wave delay lines required and the amount of different in response between the desired peak and the other residual peaks. While a specific embodiment is disclosed here for purposes of illustration, the invention is not limited to this embodiment. The number of possible bandpass frequencies may be other than 27 and the bandpass frequencies need not be equispaced.

Figure 3:
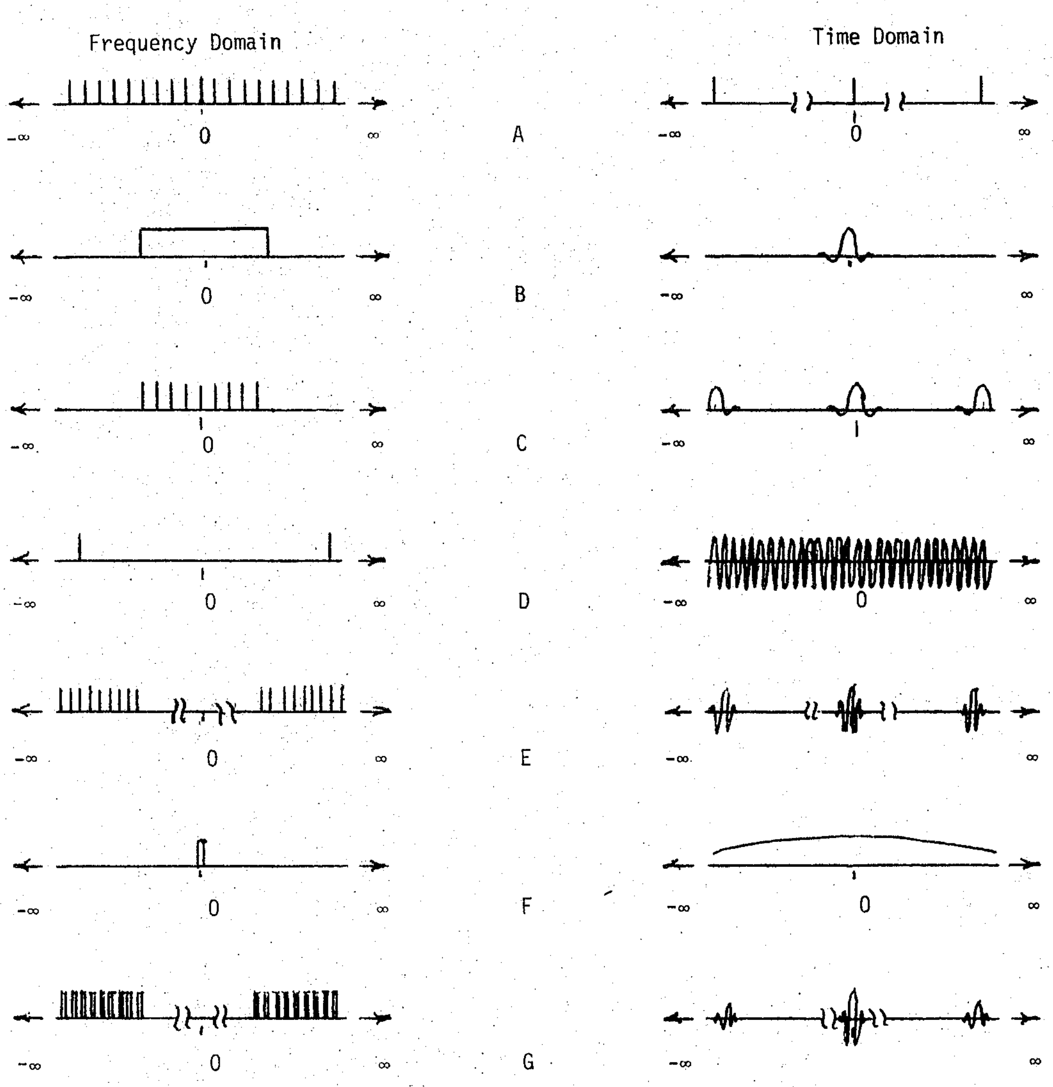
FIG. 3 illustrates a series of Fourier transform pairs leading to the impulse response of an interdigital transducer.

With reference to the structure of the individual delay lines, it is seen in FIG. 2A that two distinct types of structures are required. The frequency responses of delay lines 31–33 and 37–39 each have nine equispaced passbands. Delay lines 34–36 on the other hand each have three clusters of three equispaced passbands. The structure required to yield the responses of the first type will be understood with reference to FIGS. 3 and 4. Specific details are directed to the response of delay line 31. In FIG. 3 are shown a series of frequency domain responses and their time domain counterparts. FIG. 3A shows a frequency domain response consisting of an infinite series of impulse functions occurring at intervals of 7.5 MHz. Its Fourier transform, or associated impulse response, is also an infinite series of impulse functions occurring at time intervals of 1/7.5 MHz. FIG. 3B shows a frequency domain response which is a gate function of width 70 MHz and centered about zero frequency. The corresponding impulse response is a sin $x/x$ function have a main lobe width of $2/70 \times 10^6$ seconds. The frequency domain response of FIG. 3C is the product of the responses shown in FIGS. 3A and 3B. This response consists of nine impulse functions centered about frequency zero and occurring at frequency intervals of 7.5 MHz. Multiplication in the frequency domain corresponds to convolution in the time domain. Thus, the corresponding impulse response is an infinite series of sin $x/x$ functions spaced according to the impulse function of FIG. 3A and each having a main lobe width equal to that of the sin $x/x$ function in FIG. 3B. FIG. 3D shows a frequency domain response consisting of two impulse functions, one occurring at +70 MHz, the other at −70 MHz. The corresponding impulse response is simply a cosine wave having a period equal to $1/70 \times 10^6$ seconds. Convolution of the frequency domain responses of FIG. 3C and 3D leads to the frequency domain response of FIG. 3E. This has the effect of translating the nine impulse functions of FIG. 3C upward in frequency so that the center impulse of this group occurs at 70 MHz. The reflection of this cluster about the zero frequency axis is also shown. Since convolution in the frequency domain corresponds to multiplication in the time domain, the corresponding impulse response in FIG. 3E is obtained by multiplying the impulse responses of FIGS. 3C and 3D. The result is an infinite series of sin $x/x$ functions each amplitude modulating a cosine wave. A filter having this response will have the corresponding frequency domain response of FIG. 3E. Note that this is exactly the frequency response of surface wave delay line 31 as illustrated in FIG. 2A where only the positive frequency portion of the response is shown.

Figure 4:
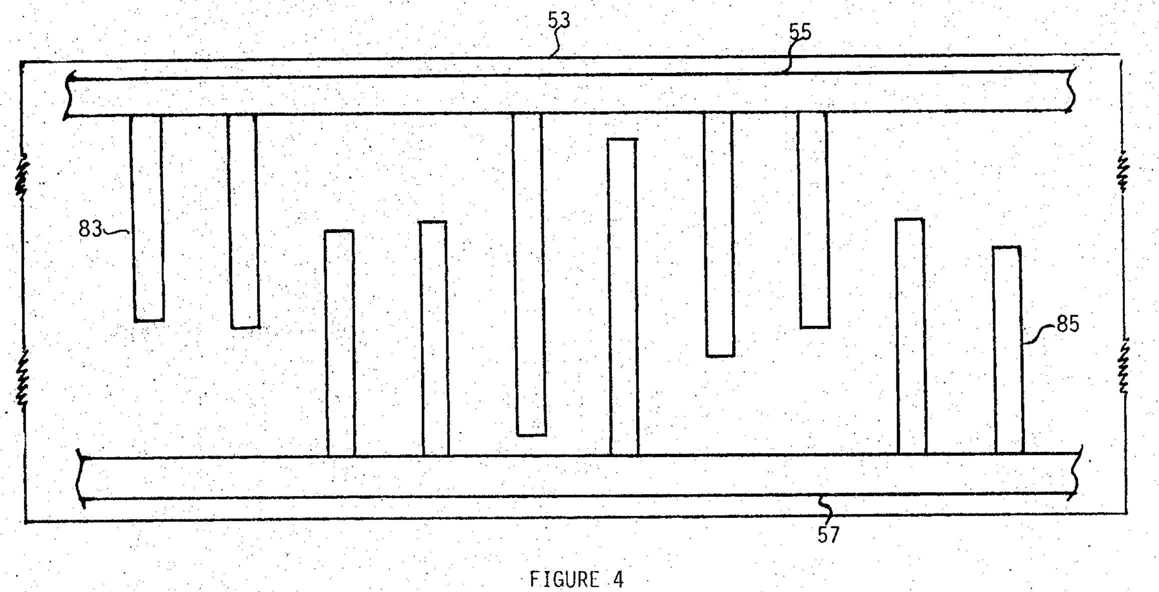
FIG. 4 shows schematically the configuration of one tap of the interdigital transducer.

In FIG. 4 is shown a structure which will yield one of the sin $x/x$ modulated cosine waves of FIG. 3E. This structure is composed of a portion of the substrate 53, portions of the conductor bars 55 and 57, a plurality of interdigital fingers 83 extending from the upper conductor bar 55 and a plurality of interdigital fingers 85 extending upward from the lower conductor bar 57. The spacing between adjacent finger is equal to one-half of the wave length at 70 MHz. That is, the spacing between adjacent fingers is such that in conjunction with the surface wave velocity of the substrate 53 the travel time from one finger to the next is equal to one-half the period of the cosine wave shown in FIG. 3D. If the overlap between adjacent fingers were everywhere equal and this structure were infinite in extent, it would have the impulse response shown in FIG. 3D. It is seen however, that the interfinger spacing is amplitude modulated by one of the sin $x/x$ functions of FIG. 3C. As a result, the impulse response of this structure is equal to the product of the impulse response of FIG. 3D and one of the sin $x/x$ functions of FIG. 3C. In other words, the impulse response of this structure corresponds to one of the infinite wavelets in FIG. 3E. Practical considerations lead to a result slightly different to that indicated by this ideal analysis. Each of the sin $x/x$ functions in FIG. 3C is actually infinite in extent while the structure of FIG. 4 is finite. The use of a finite structure has the effect of truncating the sin $x/x$ function in the time domain. The shape of this ideal sin $x/x$ function results from the use of a gate function frequency response in FIG. 3B. The truncating the sin $x/x$ function will result in slight distortions in the gate function frequency response. The gate function can be approximated as closely as desired by extending the sin $x/x$ structure shown in FIG. 4. Time domain approximations other than the truncated sin $x/x$ function may also be used. The actual impulse response of FIG. 3E consists of an infinite series of these sin $x/x$ modulated cosine waves. To achieve this idealized impulse response would require an infinite series of taps such as that illustrated in FIG. 4, spaced at time intervals corresponding to the spacing between the time domain impulse functions of FIG. 3A. This impractical requirement is alleviated by sacrificing the sharpness of the impulse functions in the frequency domain response of FIG. 3E. In FIG. 3F is shown a very narrow gate function frequency domain response and its corresponding time domain impulse response which is a very broad sin $x/x$ function. Again, the use of a gate function and its associated sin $x/x$ impulse response in FIG. 3F is only one of many possible choices. Convolution of the frequency domain responses of FIGS. 3E and 3F leads to the response of FIG. 3G. The result is a series of nine very narrow passbands rather than the nine impulse function passbands of FIG. 3E. Again, since convolution and frequency domain correspond to multiplication in the time domain the corresponding impulse response in FIG. 3G is the product of the impulse responses of FIGS. 3E and 3F. This impulse response again consists of an infinite series of sin $x/x$ modulated cosine waves but now the largest amplitude in each of these wavelets is modulated by the very broad sin $x/x$ function of FIG. 3F. If this infinite series of wavelets is truncated at some point, that is, if the sin $x/x$ function of FIG. 3F is truncated, this will have the corresponding effect of slightly distorting the gate function frequency domain response of FIG. 3F or of slightly changing the shape of each of the narrow bandpasses in FIG. 3G. Such distortion will have little effect on the bandwidth of each of these narrow bandpasses and hence is of little consequence. The result is that the practical impulse response of FIG. 3G need only consist of a finite series of sin $x/x$ modulated cosine function wavelets. This is achieved with an interdigital transducer composed of a finite number of taps such as that illustrated in FIG. 4. The spacing between adjacent time domain impulses in FIG. 3A is $1.33 \times 10^{-7}$ seconds. The spacing between adjacent taps in the interdigital transducer will be such that the travel time from one tap to the next is $1.33 \times 10^{-7}$ seconds. All interfinger overlaps in a given tap will be scaled by a quantity corresponding to the amplitude of the wavelet in FIG. 3G which it represents. The use of this interdigital transducer in delay line 31 then will lead to the frequency domain response 65 in FIG. 2A. The frequency responses of delay lines 32 and 33 are achieved in a similar fashion. The center frequency of the cluster of nine bandpasses in the frequency response of delay line 32 occurs at 137.5 MHz. In FIG. 3D it is seen that the center frequency of the cluster is determined by the frequency of the cosine function. This in turn determines the spacing between adjacent fingers within any tap such as that shown in FIG. 4. To realize the frequency response of delay line 32 it is necessary to space these adjacent fingers at one-half the wave length of a 137.5 MHz cosine function. Similarly, to realize the frequency response of delay line 33 it is necessary to space adjacent fingers at one-half the wave length of 205 MHz cosine function.

A second modification leads to the responses of delay lines 37, 38 and 39. In these cases the spacing between adjacent narrow bandpasses is 22.5 MHz rather than 7.5 MHz. As a result, in the case of these three delay lines, the spacing between the time domain impulses in FIG. 3A is only $4.45 \times 10^{-8}$ seconds. From the discussion above it is seen that this spacing determines the spacing between adjacent taps of the interdigital transducer. In the case of delay lines 37–39 this intertap spacing is only one-third of the corresponding spacing for delay lines 31–33. The center bandpass of the nine bandpasses in surface wave delay lines 37, 38 and 39 occur at 170 MHz, 177.5 MHz and 185 MHz, respectively. These frequencies determine the spacing between adjacent fingers within a tap for these three interdigital transducers.

The responses 68, 69 and 70 in FIG. 2A corresponding to delay lines 34, 35 and 36 differ in an important respect from the other responses shown in FIG. 2A. These responses also include nine impulse functions but they are clustered in groups of three with significant intervals of zero transmission separating the clusters. Realization of such frequency responses requires a slight modification of the preceding discussion.

Figure 5:
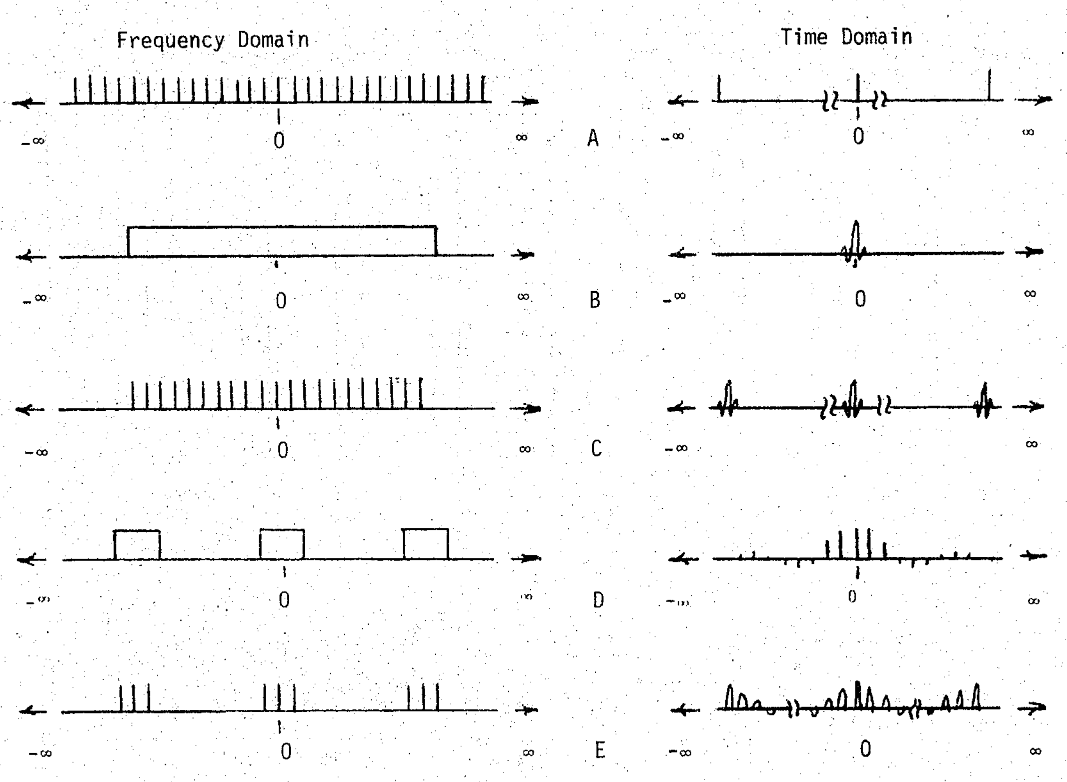
FIG. 5 shows a series of Fourier transform pairs leading to the impulse response of a second type of interdigital transducer.

FIG. 5A shows a frequency domain response consisting of an infinite train of impulse functions with 7.5 MHz spacing between adjacent im impulse functions. The corresponding time domain impulse response is also an infinite series of impulse functions. In FIG. 5B is shown a frequency domain response consisting of a gate function of width 155 MHz. It will be noted that this gate function is wide enough to span 21 of the impulse functions in the frequency response function of FIG. 3A. The corresponding time domain impulse response in FIG. 5B is a very narrow sin $x/x$ function. For purposes of clarity only the major lobe of the sin $x/x$ function is illustrated. When the response functions of FIGS. 5A and 5B are multiplied there results a finite train of 21 impulse functions as illustrated in FIG. 5C. The corresponding time domain impulse response is an infinite train of sin $x/x$ wavelets. In FIG. 5D is shown a response function consisting of an infinite series of gate functions. Each of these gate functions is 20 MHz wide. That is, wide enough to span three of the impulse functions of the FIG. 5C response function. These gate functions are spaced at a frequency interval of 67.5 MHz, that is, the spacing between the centers of the clusters of response 68 in FIG. 2A. The corresponding impulse response of this infinite series of gate functions is an infinite series of impulse functions modulated by a fairly broad sin $x/x$ function. When the frequency response functions of FIG. 5C and 5D are multiplied there results a frequency response function of FIG. 5E. This consists of three clusters of three impulse functions each. Convolution of the impulse functions of FIGS. 5C and 5D leads to the impulse response of FIG. 5E rather than the impulse response function of FIG. 3C which consisted of an infinite series of equal amplitude sin $x/x$ functions. The impulse response of FIG. 5E consists of an infinite series of clusters of sin $x/x$ functions. The maximum value of the sin $x/x$ functions within any of these clusters is further modulated by a relatively broad sin $x/x$ function. The frequency response function of FIG. 5E is next translated up in frequency by convolution with the response of a cosine function such as that illustrated in FIG. 3D. In this case, since the center frequency of the desired response function 68 in FIG. 2A occurs at 115 MHz the frequency of this cosine function must be 115 MHz. The net result of this translation in the time domain is that each of the sin $x/x$ wavelets of FIG. 5E becomes the modulation envelope for the 115 MHz cosine function as was illustrated in FIG. 3E. This impulse response function is further modulated by the impulse response function of FIG. 3F in order to make it finite and therefore realizable. The final impulse response function therefore is similar to that illustrated in FIG. 3G. That impulse response function however consisted of a finite series of sin $x/x$ modulated cosine function wavelets. Now each of those sin $x/x$ modulated cosine function wavelets becomes a cluster of similar wavelets. Each of these wavelets is realized with a tap on the interdigital input transducer of the form illustrated in FIG. 4. Scaling of the interdigital finger overlap for each of these taps is in accordance with the discussion above.

The frequency response function 69 and 70 in FIG. 2A for delay lines 35 and 36 differ from that of delay line 34 only in that the frequency of the center impulse function in their responses is shifted upward in frequency. This requires that in the realization discussed above the cosine function for these two delay lines must occur at frequencies of 137.5 MHz and 160 MHz, respectively.

Practice of this invention requires the design of two basic types of input interdigital transducer structures. One of these types is exemplified by responses 65–67 and 71–73 in FIG. 2A. These responses have the characteristic of containing a finite number of equispaced very narrow bandpasses. The other type of interdigital input transducer structure has a frequency response function illustrated by the functions 68–70 of FIG. 2A. These response functions have the characteristic of containing a finite number of clusters of equispaced very narrow bandpasses. The design of both of these basic types of structures has been discussed herein. Surface wave devices employing these two basic types of structures are combined in accordance with the principles set out herein to realize a filter with the desired properties.

One method for realizing the frequency responses illustrated in FIG. 2A has been disclosed. As a result of the great flexibility of surface wave devices, there exist many other embodiments which will yield the same frequency responses. Any such embodiment is capable of use in the present invention.

TABLE I

| PASSBAND NUMBER | SWITCHES CLOSED | | |
|---|---|---|---|
| 1 | 13 | 16 | 19 |
| 2 | 13 | 16 | 20 |
| 3 | 13 | 16 | 21 |
| 4 | 13 | 17 | 19 |
| 5 | 13 | 17 | 20 |
| 6 | 13 | 17 | 21 |
| 7 | 13 | 18 | 19 |
| 8 | 13 | 18 | 20 |
| 9 | 13 | 18 | 21 |
| 10 | 14 | 16 | 19 |
| 11 | 14 | 16 | 20 |
| 12 | 14 | 16 | 21 |
| 13 | 14 | 17 | 19 |
| 14 | 14 | 17 | 20 |
| 15 | 14 | 17 | 21 |
| 16 | 14 | 18 | 19 |
| 17 | 14 | 18 | 20 |
| 18 | 14 | 18 | 21 |
| 19 | 15 | 16 | 19 |
| 20 | 15 | 16 | 20 |
| 21 | 15 | 16 | 21 |
| 22 | 15 | 17 | 19 |
| 23 | 15 | 17 | 20 |
| 24 | 15 | 17 | 21 |
| 25 | 15 | 18 | 19 |
| 26 | 15 | 18 | 20 |
| 27 | 15 | 18 | 21 |

What is claimed is:

1. A selectable frequency filter comprising:

substrate means defining at least a substrate surface layer of piezoelectric material capable of propagating acoustic surface waves, a plurality of electrical filters disposed on the piezoelectric surface of said substrate means, each of said electrical filters comprising input and output acoustic surface wave transducers so constructed and arranged to provide a frequency response including at least one relatively narrow passband centered at a frequency chosen from a pre-determined set of discrete frequencies and effectively zero transmission elsewhere, the frequency responses of the respective input and output acoustic surface wave transducers comprising the individual electrical filters differing from each other, at least one set of input and output acoustic surface wave transducers providing a frequency response including a plurality of relatively narrow passbands centered at a plurality of frequencies chosen from the pre-determined set of discrete frequencies wherein at least one of said plurality of relatively narrow passbands coincides with a relatively narrow passband included in a frequency response of another set of input and output acoustic surface wave transducers, switching means operably associated with each of said plurality of electrical filters and being selectively closed to connect particular electrical filters in parallel between the input and output of the selectable frequency filter, the particular electrical filters connected in parallel including at least two filters having coinciding relatively narrow passbands included in the frequency responses thereof such that reinforcement of duplicated relatively narrow passbands occurs to provide a resultant frequency response having a dominant relatively narrow passband at one frequency of the pre-determined set of discrete frequencies at which the selectable frequency filter passes energy more readily than at any other frequency.

2. A selectable frequency filter as set forth in claim 1, wherein the frequency responses within all of said relatively narrow passbands are substantially equal.

3. A selectable frequency filter as set forth in claim 1, wherein said switching means comprises a plurality of semiconductor switches respectively corresponding to each of said electrical filters.

4. A selectable frequency filter as set forth in claim 1, wherein said input and output acoustic surface wave transducers of each of said electrical filters are interdigital transducers, and the frequency response of each electrical filter being the product of the frequency responses of its input and output interdigital transducers.

5. A selectable frequency filter as set forth in claim 1, wherein each of the plurality of particular electrical filters to be connected in parallel by the selective closing of said switching means has a relatively narrow passband included in the frequency response thereof also present in the frequency responses of the other ones of the plurality of particular electrical filters, such that the duplicated relatively narrow passbands are added in the resultant frequency response in producing the dominant relatively narrow passband.

6. A selectable frequency filter as set forth in claim 5, wherein said switching means is constrained to be selectively closed in one of a plurality of connection sequences for connecting only predetermined combinations of electrical filters in parallel between the input and output of the selectable frequency filter, and each of the said predetermined combinations of electrical filters providing a resultant frequency response with a different dominant relatively narrow passband.

7. A selectable frequency filter as set forth in claim 6, wherein said plurality of electrical filters is comprised of plural groups of electrical filters each having respective pluralities of electrical filters included as representatives thereof, the frequency responses of the plurality of electrical filters of each group having common characteristics as to the number and arrangement of the relatively narrow passbands included therein but having a progressive sequence of the relatively narrow passbands so as to be free from duplication thereof within the same group, and the respective groups of electrical filters being related to each other in a mathematical ratio such that duplication of relatively narrow passbands occurs in the frequency responses of respective representatives of each of said plural groups.

8. A selectable frequency filter as set forth in claim 7, wherein said switching means is constrained to selectively connect only one electrical filter from each group of electrical filters in parallel between the input and output of the selectable frequency filter to provide a resultant frequency response having a dominant relatively narrow passband at a selected frequency from one combination of electrical filters connected in parallel by said switching means.

* * * * *